United States Patent
Bhattacharya

(10) Patent No.: US 7,479,801 B2
(45) Date of Patent: Jan. 20, 2009

(54) POWER GATING TECHNIQUES ABLE TO HAVE DATA RETENTION AND VARIABILITY IMMUNITY PROPERTIES

(75) Inventor: Subhrajit Bhattacharya, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/034,185

(22) Filed: Feb. 20, 2008

(65) Prior Publication Data
US 2008/0143431 A1 Jun. 19, 2008

Related U.S. Application Data

(60) Division of application No. 11/498,009, filed on Aug. 1, 2006, which is a continuation of application No. 10/978,067, filed on Oct. 28, 2004, now Pat. No. 7,126,370.

(51) Int. Cl.
*H03K 17/16* (2006.01)
*H03K 19/003* (2006.01)

(52) U.S. Cl. ............... 326/33; 326/112; 326/119

(58) Field of Classification Search .......... 326/33, 326/93–98, 112, 119, 121
See application file for complete search history.

(56) References Cited

U.S. PATENT DOCUMENTS

| | | | |
|---|---|---|---|
| 6,208,171 B1 | 3/2001 | Kumagai et al. | 326/121 |
| 6,384,674 B2 | 5/2002 | Tanizaki et al. | 327/544 |
| 6,512,394 B1 | 1/2003 | Parris | 326/34 |
| 6,552,596 B2 * | 4/2003 | Cowles et al. | 327/318 |
| 6,556,071 B2 | 4/2003 | Notani et al. | 327/544 |
| 6,977,519 B2 * | 12/2005 | Bhavnagarwala et al. | 326/34 |

OTHER PUBLICATIONS

T. Kuroda and T. Fujita et al., "A 0.9V, 150MHz, 10mW, 4mm², 2-DCT core processor with variable VT scheme", IEEE J. Solid-State Circuits, vol. 31, pp. 1770-1778, Nov. 1996.
A. Keshavarzi, S. Ma, S. Narendra, B. Bloechel, K. Mistry, T. Ghani, S. Borkar, V. De, "Effectiveness of reverse body bias for leakage control in scaled dual Vt CMOS ICs", ISLPED 2001 pp. 207-212, no month.

(Continued)

*Primary Examiner*—Anh Q Tran
(74) *Attorney, Agent, or Firm*—Harrington & Smith, PC

(57) ABSTRACT

A power gated semiconductor integrated circuit comprises: (1) logic circuit to be power gated, said logic circuit having a virtual ground rail; (2) footer device disposed between said virtual ground rail and a ground rail for reducing power consumption of said logic circuit; and (3) virtual rail voltage clamp disposed electrically in parallel with said footer device for limiting the voltage at the virtual ground rail, the virtual rail voltage clamp comprising at least one NFET. A total of $N_f$ NFETs are connected to the virtual ground rail of the integrated circuit for use as both virtual rail voltage clamps and footer devices. A quantity of $N_{max\text{-}VC}$ NFETs are scanned and perform the function of voltage clamps and the remaining ($N_f - N_{max\text{-}VC}$) NFETs perform power gating. Manufacturing variability immunity and tuning of the variability immunity is achieved by adjusting the quantity $N_{max\text{-}VC}$ based upon testing of the manufactured integrated circuit.

6 Claims, 9 Drawing Sheets

OTHER PUBLICATIONS

S. Mutoh etal, "1-V Power Supply High-Speed Digital Circuit Technology with Multithreshold-Voltage CMOS", In IEEE Journal of Solid-State Circuits, vol. 30, No. 8, Aug. 1995 pp. 847-854.

K. Kumagai, H. Iwaki, H. Yoshida, H. Suzuki, T. Yamada, S. Kurosawa, "A Novel Powering-down Scheme for Low $V_t$ CMOS Circuits", IEEE Symposium on VLSI Circuits, 1998, pp. 44-45, no month.

S. Shigematsu, S. Mutoh, Y. Matsuya, J. Yamada, "A 1-V high speed MTCMOS circuit scheme for power-down applications", IEEE Symposium on VLSI Circuits Digest of Technical Papers, 1995, pp. 125-126, no month.

\* cited by examiner

1. ADD $N_f$ NUMBER OF NFETs TO THE CIRCUIT AND CONNECT THEM AS REQUIRED TO IMPLEMENT POWER GATING.

2. ADD $N_{max\_VC}$ NUMBER OF LATCHES IN A SCAN CHAIN TO THE CIRCUIT. THE OUTPUT OF EACH LATCH CONTROLS ONE NFET ADDED IN STEP 1.

3. CONNECT THE REST OF THE NFETs ($N_f - N_{max\_VC}$) TO A SEPARATE CONTROL SIGNAL, $S_{sleep\_n}$, AS IS DONE IN CONVENTIONAL POWER GATING.

FIG.5

1. MANUFACTURE AND TEST THE CIRCUIT. FIND $V_{act\_clamp}$ AND $I_{leak}$ DURING TESTING PHASE.

2. FROM VC_CNT TABLE, FIND NUMBER $N_{act\_vc}$ OF NFETs THAT HAVE TO BE USED FOR VOLTAGE CLAMP. CREATE A SCAN PATTERN WITH $N_{act\_vc}$ NUMBER OF "1"s AND ($N_{max\_vc} - N_{act\_vc}$) NUMBER OF "0"s. THIS WILL ENSURE THAT $N_{act\_vc}$ NFETs ACT AS VOLTAGE CLAMPS.

3. FEED THE SCAN PATTERN INTO SCAN CHAIN CREATED IN FIGURE 5.

FIG.6

POWER GATING TECHNIQUES ABLE TO HAVE DATA RETENTION AND VARIABILITY IMMUNITY PROPERTIES

CROSS-REFERENCE TO A RELATED PATENT APPLICATION

This is a divisional application of U.S. patent application Ser. No. 11/498,009 (filed Aug. 1, 2006), which is itself a continuation application of U.S. patent application Ser. No. 10/978,067 (filed Oct. 28, 2004 and now issued as U.S. Pat. No. 7,126,370). This application hereby claims priority to Oct. 28, 2004 through the above chain of applications.

BACKGROUND OF THE INVENTION

The present invention relates, in general, to semiconductor integrated circuits, and, more specifically, to a semiconductor integrated circuit and methods therefore capable of reducing leakage current and hence, power consumption by controlling the supply of power for an internal logic circuit in accordance with active state and sleep state of the internal circuit.

Increased power dissipation is becoming a major challenge in the design of integrated circuits. Increased power dissipation causes several problems including reducing battery life in mobile systems, expensive packaging and cooling solutions and can also result in chip failures. Of the various components contributing to power dissipation, leakage or static power dissipation is growing very fast and is predicted to exceed dynamic power dissipation in the near future.

Much effort has gone into investigating methods for reducing and controlling leakage in circuits. The multi-$V_{th}$ technique (see Kuroda et al., "A 0.9 V, 150 MHz, 10 mW, 4 mm$^2$, 2-DCT Core Processor with Variable VT Scheme," IEEE J. Solid-State Circuits, vol. 31, pp. 1770-1778, November 1996, the disclosure of which is hereby incorporated by reference) uses high threshold circuits in non-critical areas and nominal or low threshold circuits in critical areas of the design. The body biasing technique (see Keshavarzi et al., "Effectiveness of Reverse Body Bias for Leakage Control in Scaled Dual Vt CMOS ICs," ISLPED 2001, the disclosure of which is hereby incorporated by reference) controls the body voltage to effectively raise the threshold voltage, in turn, reducing leakage in circuits. Also, since leakage power is directly proportional to the logic area, any technique which reduces area also reduces leakage. There are various synthesis algorithms which target leakage. Power gating (see Mutoh et al., "1-V Power Supply High-Speed Digital Circuit Technology with Multithreshold-Voltage CMOS," IEEE Journal of Solid-State Circuits, Vol. 30, No. 8, August 1995, the disclosure of which is hereby incorporated by reference) is another highly effective technique which uses sleep transistors to cut off the power supply to the logic circuit in an idle state.

Power gating is implemented by introducing one or more sleep transistors (could be a header transistor 12 which is typically a PFET, or a footer transistor 14 which is typically an NFET, or both) as shown in FIG. 1. When the logic circuitry 16 in FIG. 1 is in an idle state, the header/footer transistor is turned off by setting a sleep signal to logic state "1" (sleep_n to logic state "0"). This has the effect of reducing standby or leakage current by an order of magnitude.

Even though power gating is very effective in reducing leakage (reduces leakage by 90% or more) and seems like a simple idea, there are many difficulties in implementing power gating. Some of the more important problems in implementing power gating are listed below. Note that many of the problems arise because in the power gated state, latches lose their data and the outputs of the logic circuit being power gated assume an unknown state.

1. The state of the latches in the power gated logic circuit may need to be stored before turning off the power gating transistors and restored during power-up.
2. Since a power gated logic circuit loses its state, fence circuitry is required to interface the power gated logic with neighboring logic which is not power gated.
3. Power gating can affect the response time of the circuit negatively. The penalty may arise since one or more cycles may be required during power gating and power-up to store and restore the state. Additional cycles may also be required to power-up the logic over several cycles to minimize voltage swings on the power rails.
4. A power management unit to control the various power gating steps has to be designed. This can require significant effort. One of the issues to be considered is when to turn a unit on or off. Another complication arises if multiple units are power gated. In this case, the power management unit has to coordinate the change of state of the multiple units since turning multiple units on or off simultaneously could cause unacceptable noise on the power rails.
5. It can be seen from the previous items that power gating adds significant burden on verification—both functional as well at the circuit levels.

The problems enumerated above are overcome by use of a modification of the power gating technique, where the modification is named power gating with data retention using virtual rail voltage clamp (VRC) (see Kumagai, et al., "A Novel Powering-down Scheme for Low $V_t$ CMOS Circuits," IEEE Symposium on VLSI Circuits, 1998, and Kumagai et al., "Semiconductor Integrated Circuit Device with Low Power Consumption and Simple Manufacturing Steps", U.S. Pat. No. 6,208,171, B1, Mar. 27, 2001, the disclosures of which are hereby incorporated by reference). However, the modification means that leakage reduction is sacrificed.

Some other related patents are M. Paris, "Technique for Efficient Logic Power Gating with Data Retention in Integrated Circuit Devices," U.S. Pat. No. 6,512,394, issued on Jan. 28, 2003, and Notani et al., "Semiconductor Integrated Circuit," U.S. Pat. No. 6,556,071, issued on Apr. 29, 2003, the disclosures of which are hereby incorporated by reference.

Power gating with a virtual rail voltage clamp can be seen in FIG. 2, where a generic voltage clamp 22 is shown in parallel to a power gating switch or footer 14. In FIG. 2, "Virtual ground" refers to a node or rail where the ground terminal of the logic circuit connects to the power gating device which in FIG. 2 is the drain of the NFET/footer. During power gating, since the footer switch 14 is off, the voltage at the drain of the footer rises and approaches $V_{dd}/2$, which causes the output signal "out" to assume an undetermined state if the output signal was initially at logic state "0". The addition of a voltage clamp circuit 22 prevents the voltage at the virtual ground from rising above a certain value determined by the characteristic of the voltage clamp circuit and the leakage current from the logic circuit being gated. The maximum steady state voltage at the virtual ground rail in the presence of a virtual rail clamp device is referred to as $V_{clamp}$. If $V_{clamp}$ is small enough, then the output state loss can be prevented. Some of the voltage clamp circuits found in the prior art literature are diodes or PFETs (see Kumagai et al., "Semiconductor Integrated Circuit Device with Low Power Consumption and Simple Manufacturing Steps," U.S. Pat. No. 6,208,171, B1, Mar. 27, 2001, the disclosure of which is hereby incorporated by reference). Since powergating with VRC prevents state loss, many of the problems associated with powergating without VRC are overcome partially or fully but at the cost of increased leakage.

SUMMARY OF THE INVENTION

The present invention provides power gating techniques able to have data retention and variability immunity properties.

In an exemplary aspect of the invention, there is a signal bearing medium tangibly embodying a program of machine-readable instructions executable by a digital processing apparatus to perform operations to implement power gating with a virtual rail voltage clamp of a semiconductor integrated circuit having a virtual ground node. The operation comprises (1) adding $N_f$ quantity of NFETs to the integrated circuit between the virtual ground rail and a ground rail for power gating and virtual rail voltage clamping, where Nf is the number of footer devices required to produce a certain amount of leakage reduction in the integrated circuit; (2) adding $N_{max\text{-}VC}$ latches in a scan chain with the output of each latch coupled to a respective one of $N_{max\text{-}VC}$ NFETS of the $N_f$ NFETs, so that the $N_{max\text{-}VC}$ NFETs act as virtual rail voltage clamps, where $N_{max\text{-}VC}$ is the maximum number of footer devices needed for said virtual ground rail to be substantially at a voltage value $V_{clamp}$, where $V_{clamp}$ is the desired steady state voltage at the virtual ground rail; and (3) coupling the remaining $(N_f\text{-}N_{max\text{-}VC})$ NFETs to a control signal, $S_{sleep\_n}$, for causing the $(N_f\text{-}N_{max\text{-}VC})$ NFETs to act as footer devices for implementing power gating of the integrated circuit.

In another exemplary aspect of the invention, a method is disclosed of implementing power gating with a virtual rail voltage clamp of a semiconductor integrated circuit having a virtual ground rail. The method comprises (1) adding $N_f$ quantity of NFETs to the integrated circuit between the virtual ground rail and a ground rail for power gating and virtual rail voltage clamping, where $N_f$ is a number of footer devices required to produce a certain amount of leakage reduction in the integrated circuit; (2) adding $N_{max\text{-}VC}$ latches in a scan chain with the output of each latch coupled to a respective one of $N_{max\text{-}VC}$ NFETS of the $N_f$ NFETS, so that the $N_{max\text{-}VC}$ NFETs act as virtual rail voltage clamps, where $N_{max\text{-}VC}$ is the maximum number of footer devices needed for said virtual ground rail to be substantially at a voltage value $V_{clamp}$, where $V_{clamp}$ is a desired steady state voltage at the virtual ground rail; and (3) coupling remaining $(N_f\text{-}N_{max\text{-}VC})$ NFETs to a control signal, $S_{sleep\_n}$, for causing the $(N_f\text{-}N_{max\text{-}VC})$ NFETs to act as footer devices for implementing power gating of the integrated circuit.

Further and still other advantages and aspects of the present invention will become more clearly apparent when the following description is read in conjunction with the accompanying drawing.

BRIEF DESCRIPTION OF THE DRAWING

FIG. 5 is an algorithm for implementing variability immune power gating circuits.

FIG. 6 is an algorithm for tuning a variability immune power gated circuit.

DETAILED DESCRIPTION

Figure 1:
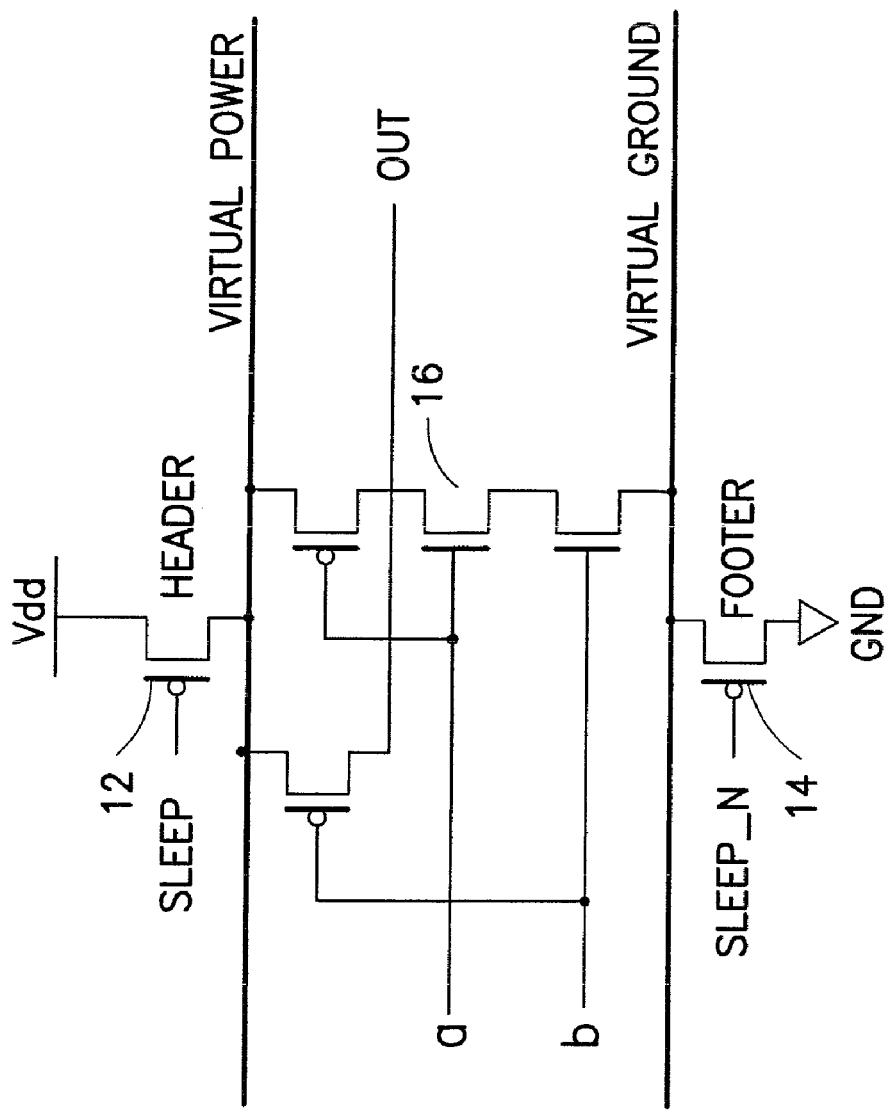
FIG. 1 is a schematic drawing of a circuit with power gating. The circuit being powergated lies between the virtual power and virtual ground lines and can be replaced by any other digital circuit. The footer or the header is used to interrupt the power supply to the digital circuit when it is idle, thus reducing leakage.
Figure 2:
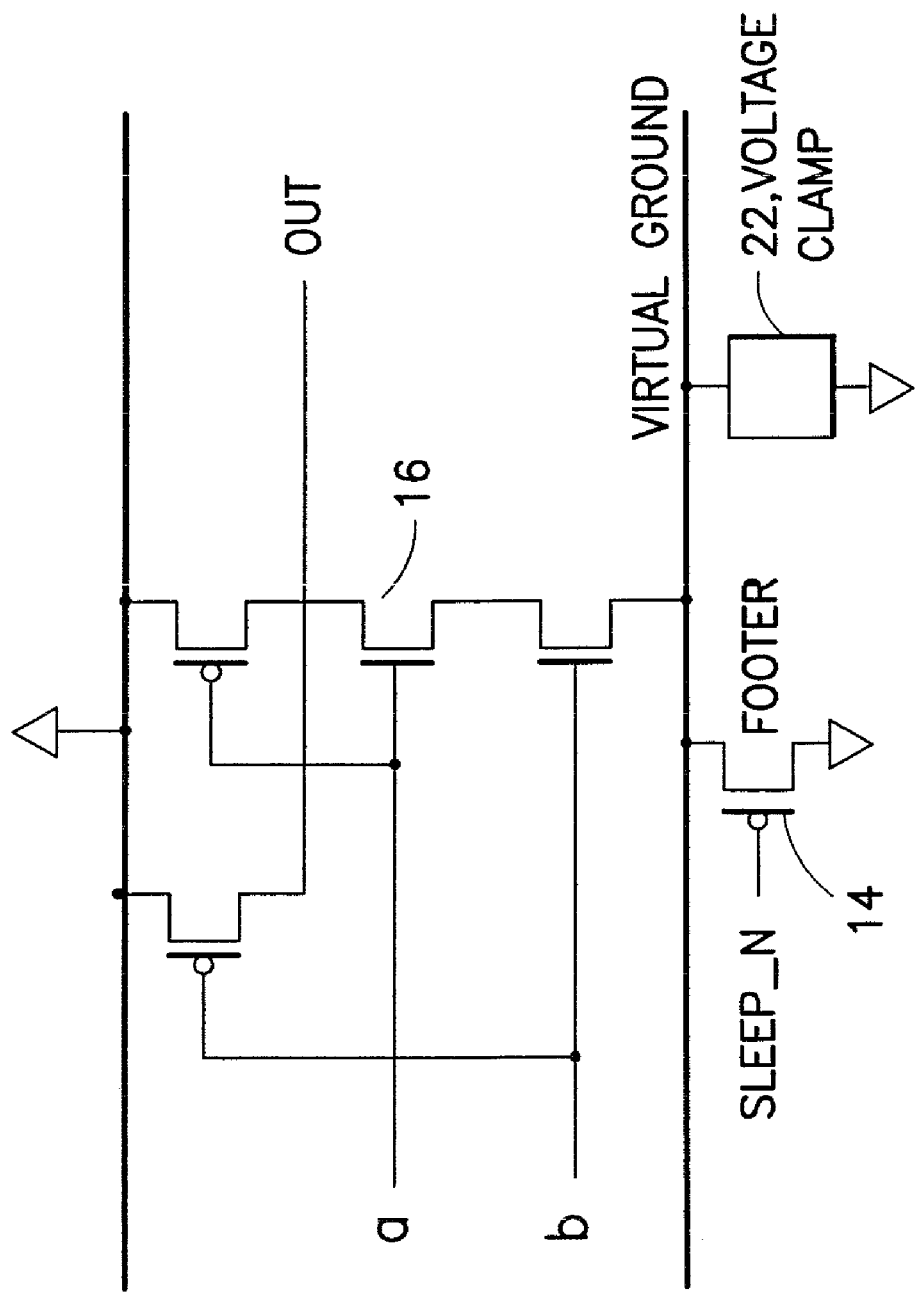
FIG. 2 is a schematic drawing of a circuit with power gating including a generic voltage clamp.

The present invention, in an exemplary embodiment, uses an NFET as a virtual rail clamp (VRC), such as voltage clamp 22 of FIG. 2, for a footer (e.g., PFET as a VRC for a header). As is described in more detail below, using an NFET as a voltage clamp for a footer is seems to be a poor choice. Nonetheless, as the disclosure will show, under the voltage ranges over which voltage clamping needs to be applied, an NFET can also work as a good voltage clamp.

Further, the disclosure will show that using a PFET or diode as a VRC requires costly modifications during manufacturing while using an NFET does not require any modifications to manufacturing. In addition, a method is disclosed to make the VRC implementation immune to manufacturing variability, which is becoming the most significant problem facing designers in addition to power with future technologies. The exemplary method for variability immunity can be modified in a manner obvious to those skilled in the art of powergating to be applicable to all forms of powergating, including powergating without VRC.

Before proceeding with a description of using one or more NFETs as voltage clamps, additional information about circuits using voltages clams will be described. As previously discussed, a simple extension to power gating uses a voltage clamp 22 (see FIG. 2) in parallel to a power gating switch or footer 14. FIG. 2 shows the concept of power gating with a virtual rail voltage clamp using a generic voltage clamp circuit. The modified power gating scheme requires the use of voltage clamp circuitry 22 and variability control circuitry 74 in FIG. 7 which will be explained later. The present description is on footers as the power gating device but the idea holds for header devices too.

"Virtual ground" refers to the node or rail where the ground terminal of the logic circuit connects to the power gating device, which in FIG. 2 is the drain of the NFET footer 14. During power gating, since the footer 14 is off, the voltage at the drain of the footer rises and approaches $V_{dd}/2$ which causes the output signal to assume an undetermined state if it was initially at logic state "0". The addition of a rail voltage clamp (VRC) circuit 22 prevents the voltage at the virtual ground from rising above a certain predetermined value. The predetermined voltage at the virtual ground rail is referred to as $V_{clamp}$. If $V_{clamp}$ is small enough and significantly smaller than $V_{dd}/2$, then the output state loss associated with power-gating without VRC can be prevented. Some of the circuits used as voltage clamps for footers found in the prior art literature are diodes or PFETs.

Figure 3:
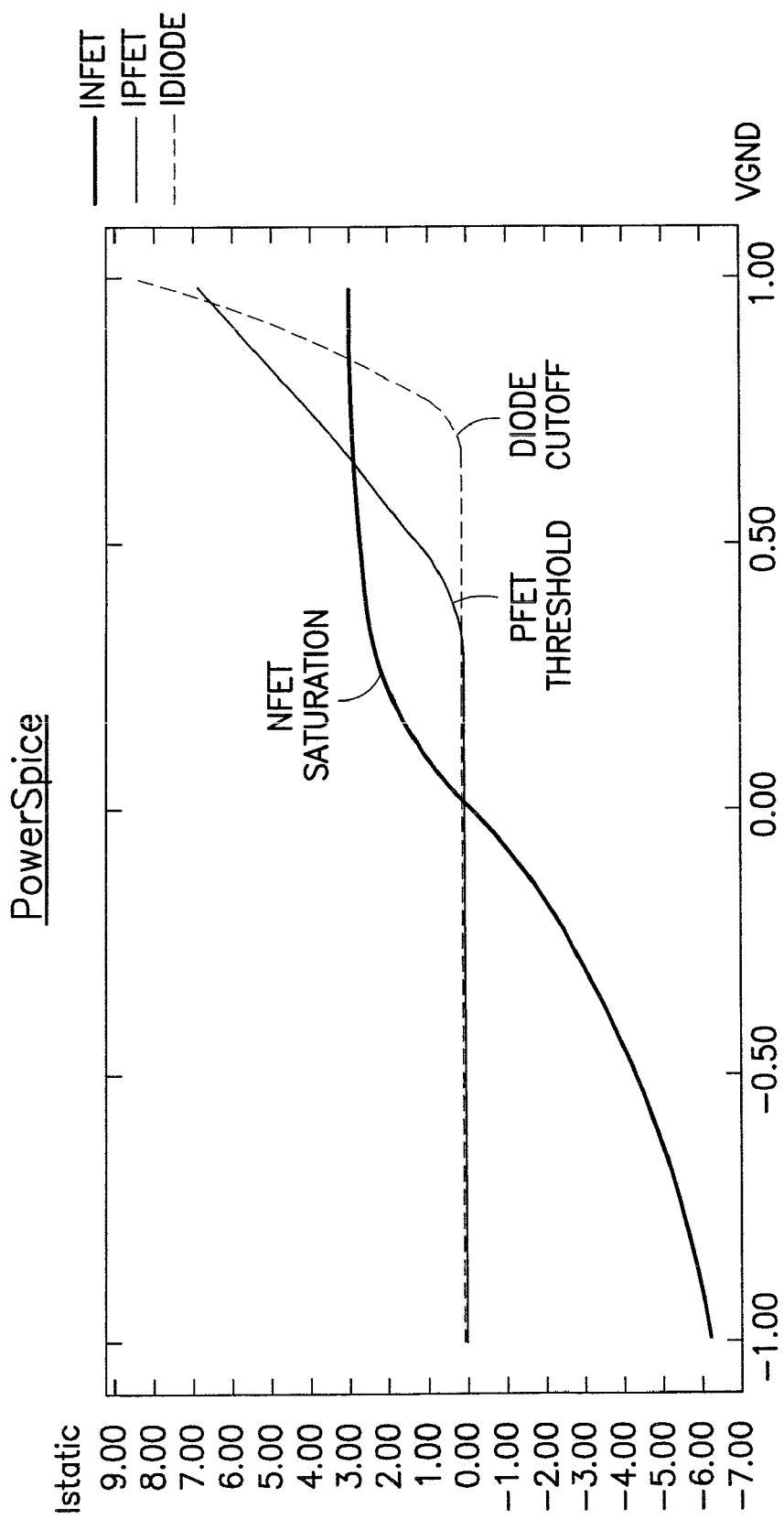
FIG. 3 is a graphical representation of V-I curves of typical voltage clamp circuits, an NFET, a PFET and a diode.

The V-I curve of diodes, PFETs and NFETs are shown in FIG. 3. Consider the curve for a diode. The diode which is operating in the forward biased mode hardly registers any current flow as long as the voltage is below its cutoff voltage. When the voltage across the diode exceeds the cutoff voltage the current through the diode increases rapidly. A very small change in voltage across the diode produces a large change in current. In other words, even when there is a large change in current through the diode, the large current change produces a small change in voltage which is what is desired of a voltage clamp.

Figure 4:
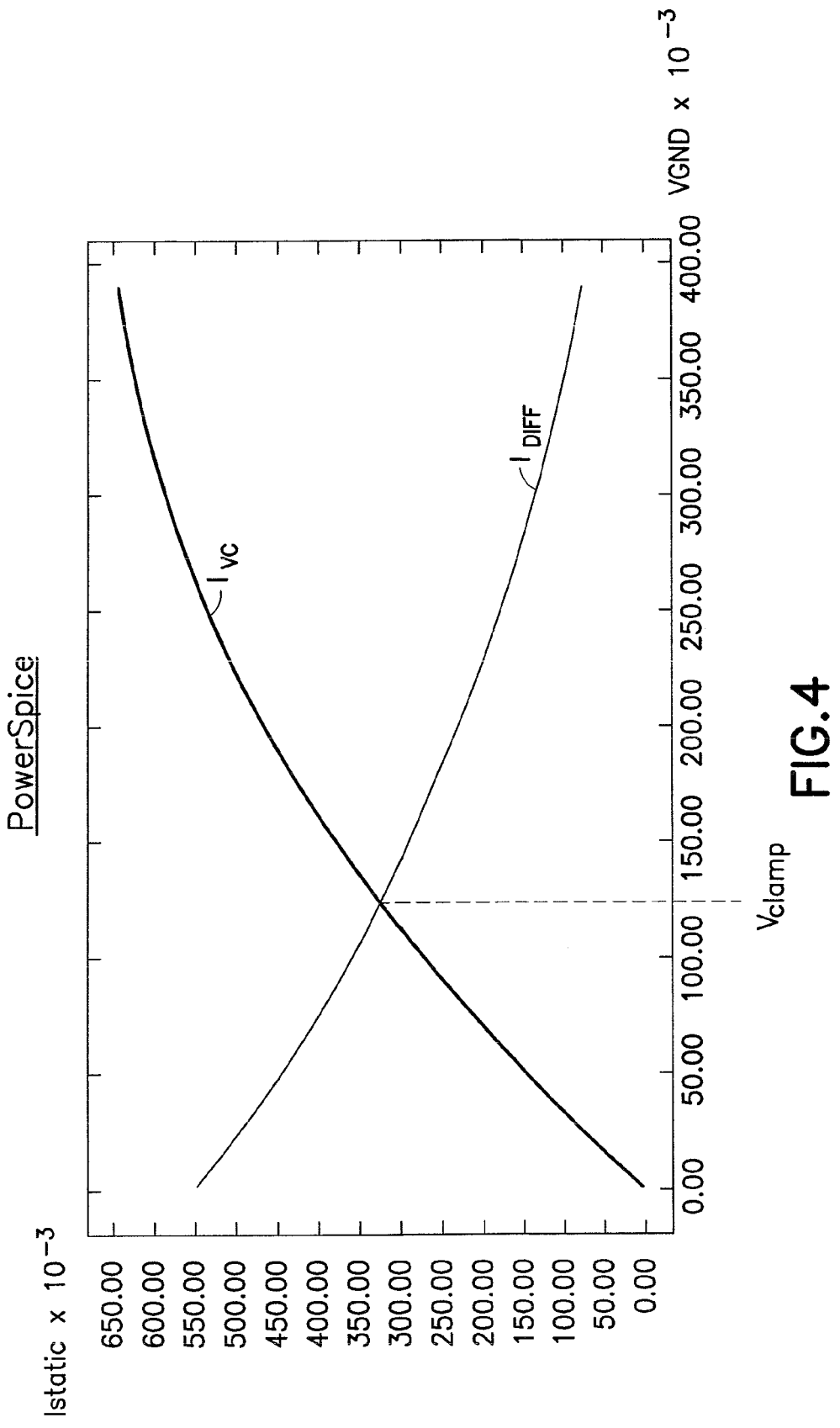
FIG. 4 is a graphical representation of a V-I curve useful for determining the operating point of an NFET footer network with VRC. The x-axis refers to the voltage on the virtual ground rail. The curve from the top left to the bottom right is for a digital circuit being powergated. As the voltage on the virtual rail increases, the voltage across the circuit drops and its leakage drops. The second curve is a V-I curve for a footer device which is off in the presence of a VRC device. As the voltage across the footers and VRC devices increase, current increases. The point where the two curves meet is the steady state voltage/current when the digital circuit being powergated is tied to the footer/VRC devices when the footers are off.

To better understand how the voltage clamp circuit works and how the steady state $V_{clamp}$ is determined, reference is made to the schematic in FIG. 2 and the V-I curves in FIG. 4. Note that the curves depend upon the relative sizes of the logic circuit that is being gated, the footer 14 size, the characteristics of the voltage clamp 22, the input values for the gated logic 16, and the like. The voltage at the virtual ground at any time is referred to as $V_{GND}$. The logic circuit 16, the footer 14, which is turned off, and the voltage clamp 22 have been simulated separately with $V_{GND}$ as the controlling variable using Spice software. The current through the logic circuit 16 either flows through the footers 14 or through the voltage clamps 33. The difference of the currents through the logic circuit 16 and the footer 14 is the current through the voltage clamps 22 and is plotted as the dotted line ($I_{DIFF}$) in FIG. 4. AS $V_{GND}$ increases, the voltage across the logic circuit 16 reduces and the leakage of the logic circuit 16 decreases rapidly while the current through the footer 14 changes minimally since the footer 16 is off. Therefore, the net current ($I_{DIFF}$) falls rapidly as $V_{GND}$ rises. The current through the voltage clamp 22, on the other hand, rises with increasing $V_{GND}$ and is plotted as the solid line in FIG. 4 ($I_{VC}$). The characteristic of the solid line will depend upon the characteristics of the voltage clamp 22. At steady state, the current through the voltage clamp 22 has to equal the difference of the current flowing out of the logic circuit and the current flowing into the footer device. Hence, the point where the two curves meet in FIG. 4 determines the operating point of the circuit in FIG. 2 when the footer 14 is off. In FIG. 4, the operating point is defined by $V_{GND}$ at 120 mV (=$V_{clamp}$) and $I_{static}$ or $I_{leak}$ of 0.3 mA.

Since the voltage at $V_{GND}$ is forced to be at or very close to 120 mV in this case, if the output is at logic state "0", then in the power gated state it does not go to $V_{DD}/2$ (500 millivolts in our experiments) but stays close to 120 mV which is still considered logic state "0". This clamping action ensures that the data at the output is not lost during power gating. Power gating with VRC reduces leakage by 40% or more compared to 90% or more reduction when powergating without VRC.

The advantages of power gating with virtual VRC requires reference to the list of problems associated with power gating without VRC enumerated above. Power gating with VRC completely addresses problem 1 and problem 2 since state information is not lost due to VRC. VRC addresses problem 3 by eliminating the cycles required for storing and restoring latch states and also reducing the number of cycles required for powering up since it produces less noise on the power rails. The power management unit design (problem 4) is simplified because state store/restore is not required and fence circuits do not have to be asserted/de-asserted. Verification of power gating (PG) (problem 5) is much simpler since the verification engineer does not have to deal with unknown states and the power management unit is simpler compared to a PG design.

Some common voltage clamp circuits are mentioned in the prior art. Each of these circuits has its advantage and disadvantage. An exemplary novelty of the present invention resides in the use of a NFET as a voltage clamp circuit, although usually an NFET is not considered a good voltage clamp. Before we proceed to discuss NFETs as a voltage clamp circuit, a theorem will now be presented which shows that in terms of the leakage metric, all voltage clamp circuits are equally good.

Theorem: For a given logic circuit being power gated by a footer circuit, if the voltage clamp circuit is changed, but $V_{clamp}$ is kept fixed, then leakage from the logic circuit is the same regardless of the voltage clamp circuit being used.

Proof of the theorem assumes that the voltage between the power rails of the logic circuit being power gated is $V_{dd}$ and $V_{clamp}$. Since $V_{clamp}$ is fixed even though the voltage clamp circuit is changed, the leakage from the logic circuit being power gated has to remain constant.

It should be noted that the above theorem does not consider the leakage from the voltage clamp circuitry itself which varies depending upon the characteristics of the voltage clamp circuitry. However, since the voltage clamp circuit itself is rather small, the leakage due to the clamp circuit will have a small effect on the total leakage. What is more important is the shape of the transfer curves of the devices at $V_{clamp}$.

Two of the common devices that are used as voltage clamps are the diode and the PFET. As can be seen from FIG. 3, the diode has a cutoff voltage below which the current through it is very low. After the cutoff voltage, the voltage-current curve is very sharp. Large changes in current lead to a small voltage change. Since it is impossible to accurately determine the current from the logic circuit being power gated, i.e. the estimate may be significantly different from the actual value, the voltage across the clamp can not be predicted accurately either. But the sharp slope of a diode implies that even if the actual leakage current is different from the expected leakage current, $V_{GND}$ will remain close to $V_{clamp}$. Hence the diode acts as a good voltage clamp device. The current through the PFET accelerates sharply after the source voltage crosses $V_{th}$ though the PFET curve in its active region is less steep than that of a diode. Hence a PFET in its active region (input "0") has behavior similar to a diode and is also a good voltage clamp.

In accordance with the present invention, one or more NFETs are used as a voltage clamp. However, the NFET has never been considered an appropriate choice for a voltage clamp. The reason can be understood by referring to FIG. 3. An NFET has a V-I curve which is not as sharp as that of a diode or a PFET and also, it flattens out above 0.3 volts as the NFET goes into saturation. However, there are a number of reasons why using one or more NFETs as voltage clamps is beneficial.

First, according to the theorem above, given a $V_{clamp}$, the efficacy of a voltage clamp is the same regardless of the voltage clamp device type. So the issue really is that $V_{GND}$ may not actually be $V_{clamp}$ due to manufacturing variations and for the NFET, the difference between $V_{GND}$ and $V_{clamp}$ might be the largest since its curve is the least steep. However, as long as $V_{clamp}$ is not high enough to be close to the voltage at which the NFET goes into saturation, the slope of the NFET's V-I curve is acceptable. A desirable $V_{clamp}$ value will not be very high since a high value of $V_{clamp}$ would reduce noise margins and increase chances of state loss. Secondly, there is a method, as will be described below, to force $V_{GND}$ to $V_{clamp}$. This method almost eliminates the dependence of the desirability of the voltage clamp on the slope of its V-I curve. For this reason, the NFET is no less attractive than a diode or a PFET as a voltage clamp.

The diode which has the best characteristics for a voltage clamp in the absence of variability faces a real challenge from variability in future technology modes. The present invention includes a method to address the variability problem. The method can be used with a PFET or a NFET voltage clamp device in conjunction with footers and with all forms of powergating, but it can not be used with a diode. For brevity we only discuss variability immunity method for NFET voltage clamps in conjunction with footers. We also discuss why an NFET is a less expensive alternative to a PFET or diode when used as a voltage clamp.

The advantage of the NFET over the diode or PFET becomes more apparent when considering manufacturability aspects. It should be clear that $V_{clamp}$ (steady state voltage at the virtual ground rail) has to be higher than $V_{TH}$ for the PFET or $V_{cutoff}$ for the diode for the curves of the PFET or diode (FIG. 3) to intersect the V-I curve for the logic circuit being power gated (FIG. 4). If $V_{TH}$ of the PFET is higher than the $V_{clamp}$ necessary to prevent state loss, a new PFET device has to be manufactured which has a lower $V_{TH}$ than the PFETs used for logic design. The same argument applies to the diode if $V_{cutoff}$ for the diode is higher than the desired $V_{clamp}$. This is usually the case since a $V_{TH}$ which is good for a voltage clamp will be significantly different from the $V_{TH}$ required for logic design. In case of the technology that was used to do our experiments, the $V_{TH}$ for the PFETs were 0.3 V while the $V_{clamp}$ desired was around 0.12 V. However, increasing the number of thresholds for the devices increases manufacturing complexity and cost. Since the NFET starts conducting when $V_{GND}$ exceeds 0 V, using a NFET device as a voltage clamp makes it unnecessary to introduce a device with a different threshold level. Having an NFET as a voltage clamp does not increase manufacturing costs while using a diode or PFET for as a voltage clamp may increase manufacturing costs.

As devices get smaller and faster, variability is becoming one of the most difficult problems facing designers. Device models typically include a worst case, best case and nominal behavior. With exceedingly small device sizes in the 90 nm and smaller technologies, the difference between the worst case and best case behavior is widening to aggravating levels. Even if the best case or nominal leakage numbers might be acceptable, the worst case leakage numbers might not be acceptable. Similarly, the worst case $V_{GND}$ may not be acceptable if it is too different from the desired $V_{clamp}$.

The aggregate behavior of the devices in a particular chip is not known until after manufacturing and testing. Hence hardwiring the design for the worst case behavior is one possible solution but the solution is a pessimistic one. On the other hand, designing all chips for the nominal behavior can have a deleterious effect on chip yield if the manufactures chips have unacceptable behavior. One solution is to include knobs in the design which can be used to tweak the chip after manufacturing and during test. The consequences of device variability on leakage and $V_{clamp}$ and a method to address the problem in the scheme of power gating with VRC after manufacturing and during test will now be described.

First consider the effect of variability of the logic circuit which is being power gated. Referring to FIG. 4, assume that the curve for the voltage clamp circuitry (IVC) remains unchanged. As the leakage for the logic circuit increases or decreases from the estimated value, the corresponding curve (IDIFF) moves up or down in the Y-axis direction. If leakage increases and the curve IDIFF moves up, the point at which the two curves intersect moves to the right, i.e., $V_{GND}$ in steady state, $V_{act\_clamp}$, is higher than the $V_{clamp}$ target, and vice-versa.

Now assume that the logic being power gated displays a fixed behavior while the footers and the voltage clamps display variable behavior. Again referring to FIG. 4, if the voltage clamp circuitry produces more current for the same voltage than was estimated, $V_{act\_clamp}$ goes down while $I_{act\_leak}$ goes up. If the voltage clamp circuitry produces less current than estimated, $V_{act\_clamp}$ goes up while $I_{act\_leak}$ goes down.

The worst case scenario is where both leakage $I_{act\_leak}$ and $V_{act\_clamp}$ increases beyond nominal values $I_{leak}$ and $V_{clamp}$. If $V_{GND}$ is lowered below $V_{act\_clamp}$, leakage would increase beyond $I_{act\_leak}$ where $I_{act\_leak}$ is already higher than $I_{leak}$.

If $V_{act\_clamp}$ is less than $V_{clamp}$ and $I_{act\_leak}$ is higher than $I_{leak}$, parity can be restored by increasing $V_{act\_lamp}$ since this action will reduce $I_{act\_leak}$ and bring it back closer to $I_{leak}$. In the case where $V_{act\_clamp}$ is more than $V_{clamp}$ and $I_{act\_leak}$ is less than $I_{leak}$ parity can be restored too if $V_{gnd}$ can be reduced to $V_{clamp}$.

The best case situation is where both $I_{act\_leak}$ and $V_{act\_clamp}$ are less than the nominal values. This situation may not require any corrective measure or may be used advantageously by reducing leakage further than $I_{leak}$ by increasing $V_{GND}$ from $V_{act\_clamp}$ to $V_{clamp}$.

We now discuss the aspect of the invention which is concerned with the control of $V_{GND}$ or the leakage so that they stay close to the desired values $V_{clamp}$ and $I_{leak}$ after manufacture and test in essence making the powergated circuit immune to manufacturing variability.

Assume that both footers as well as voltage clamp devices are implemented using NFETs. A logical footer is usually implemented as a grid of connected distributed footer devices. Regardless of the way in which the footers are distributed in the layout, a distributed footer scheme will have a common virtual ground rail. The virtual ground rail is implemented as a grid connecting the ground pins of the logic devices being powergated to the drains of the distributed footers. The voltage clamp NFETs are physically the same as any NFET footer and they are also connected in parallel to the NFET footers. The essential difference between the footers and the voltage clamp NFETs is the voltage clamp NFETs are always ON while the footer NFETs are ON or OFF depending upon whether the logic circuit is in an active state or low leakage state respectively.

Let $N_f$ be the total number of NFETs in the powergated circuit. Let $N_{VC}$ be the number of voltage clamp NFETs required to achieve $V_{clamp}$ at the virtual ground rails when the $(N_f-N_{VC})$ footers are turned off (the $N_{VC}$ voltage clamps are always on). $I_{leak}$ is the leakage when the footers are turned off while the VRC devices are on. From experimental results described below, it will be seen that $N_{VC}$ is usually a very small fraction of $N_f$. We next describe steps to implement variability immunity to power gated circuits which have voltage clamp and footer NFETs.

Assume that based on variability analysis and estimates, $V_{act\_clamp}$ is expected to vary between $V_{low\_clamp}$ and $V_{high\_clamp}$. Divide the range $(V_{high\_clamp}-V_{low\_clamp})$ into smaller sub-ranges. For sub-ranges between $V_{low\_clamp}$ and $V_{clamp}$ estimate the extra number of NFETS compared to $N_{VC}$ which have to be turned off to raise $V_{act\_clamp}$ to $V_{clamp}$. For sub-ranges from $V_{clamp}$ to $V_{high\_clamp}$, estimate the extra number of NFETs which have to be turned on to lower $V_{act\_clamp}$ to $V_{clamp}$. The estimates are performed using Spice software simulations. The sub-ranges and as well as the number of NFETs that have to be turned off or on are stored in a table which is called the VC_COUNT table. Also, let the maximum number of NFETs which need to be used as voltage clamps be $N_{max\_VC}$. Assume that $N_f$ is a number so that $(N_f-N_{max\_VC})$ are required to reduce leakage from the power-gated circuit. The algorithm for implementing a variability immune power gating circuit design is shown in FIG. 5 and the algorithm to tune a variability immune power gating circuit is shown in FIG. 6. The algorithms are based on the above descriptions.

The steps of the algorithm in FIG. 5 for implementing a variability immune power gating circuit are first, add $N_f$ number of NFETs to the logic circuit and connect them, as is known to one skilled in the art, as required to implement power gating. Then, add $N_{max\_VC}$ number of latches in a scan chain to the power gating circuit. The output of each latch controls one NFET added in the previous step. Finally, connect the rest of the NFETs $(N_f-N_{max\_VC})$ to a separate control signal, $S_{sleep\_n}$, as is done in conventional power gating arrangements. The result is a variability immune power gating circuit design. An example power gated circuit which can be tuned for variability is shown in FIG. 7.

The steps of the algorithm in FIG. 6 to tune a power gating circuit are first, manufacture and test the circuit. Find $V_{act\_clamp}$ and $I_{leak}$ during the test phase. Next, from a VC_CNT table find the number, $N_{act-VC}$, of NFETs that have to be used for voltage clamp purposes to achieve $V_{clamp}$ from the measured values of $V_{act\_clamp}$ and $I_{leak}$. Create a scan pattern with $N_{act\_VC}$ number of "1"s and rest "0"s to ensure that $N_{act-VC}$ NFETs are turned on and behave as voltage clamps. Finally, feed the scan pattern into the scan chain created using the algorithm in FIG. 5. The result is a power gating circuit corrected in the presence of variability to work as desired.

It should be noted that the above algorithms are applicable to PFET voltage clamps in conjunction with headers also but not to diodes since diodes do not have any node which allows turning the diodes on or off.

Figure 7:
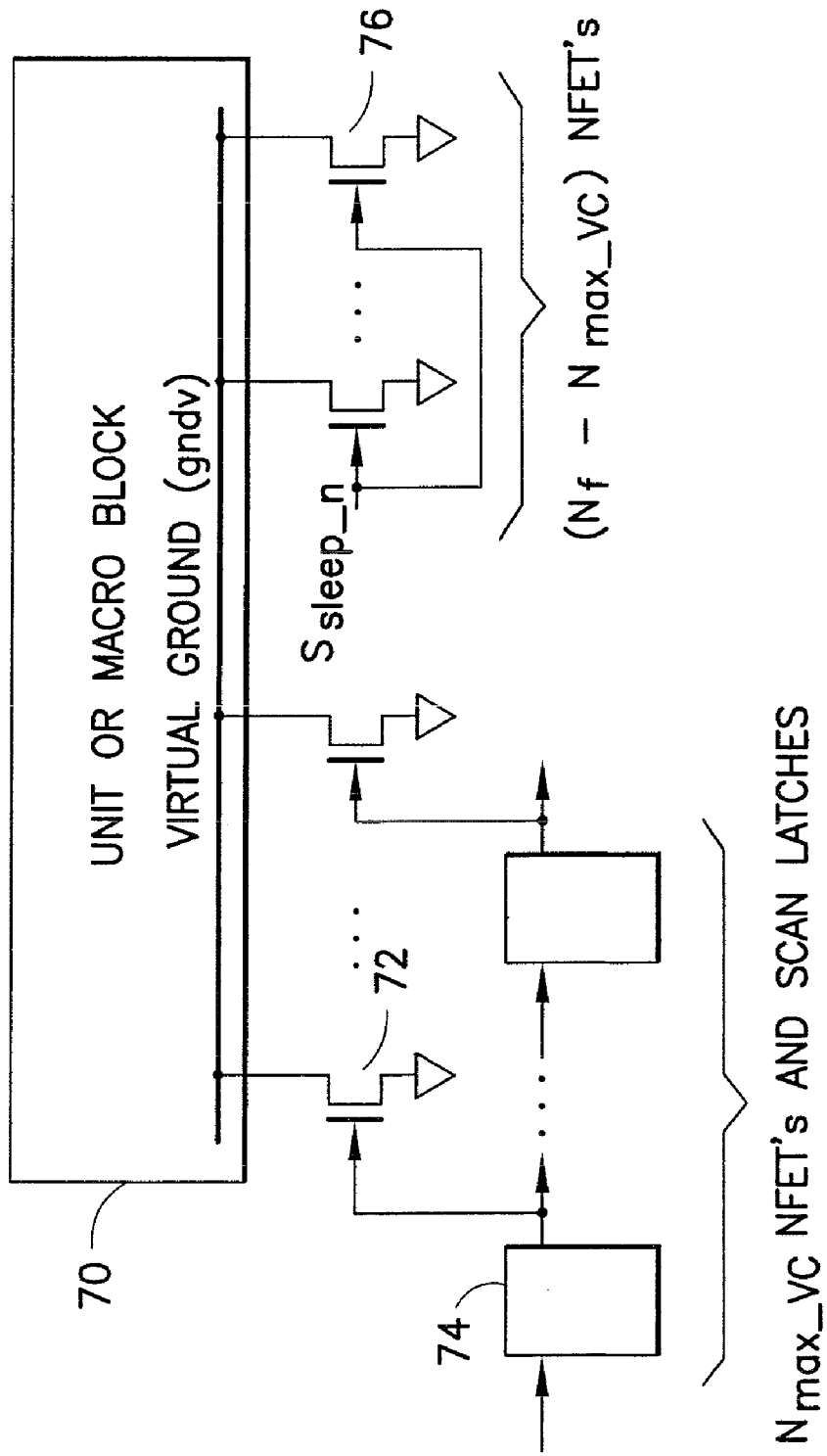
FIG. 7 is a schematic block diagram of a power gated circuit modified with scan latches used for implementing variability immunity.

FIG. 7 is a schematic block diagram illustrating the algorithm of FIG. 5 and FIG. 6. $N_f$ NFETs 72 are added to the logic circuit 70 as required to implement power gating. $N_{max-VC}$ latches 74 are added in a scan chain so that the output of each latch 74 controls the input of a respective one of the $N_f$ NFETs 72 for causing those NFETs to act as voltage clamps. The remaining $(N_f-N_{max-VC})$ NFETs 76 are connected to and controlled by control signal $S_{sleep\_n}$ in a manner well known to those skilled in the art for power gating.

Experiments were performed in IBM's cmos11s (65 nm) technology. The operating $V_{dd}$ was 1.0 V. We used a 1 bit full adder circuit as the logic circuit to be power gated. Assume that the footer size is given as a fraction of the size of the logic to be power gated, in this case as a fraction of the adder size. We used a value of 6% to compute the footer size to be used with the full adder. Let 6% of the sum of the width of the devices in the adder be W. In our experiments, we used a single NFET device of width (1−f) W as a footer and a single NFET device of width f·W as a voltage clamp where f is a fraction. The width of the footer or VRC NFET varies according to the fraction f. When f is 0, we have only a footer and no voltage clamp. If f is 1, in essence we have no footers at all. All simulations were done using Spice software.

Figure 8:
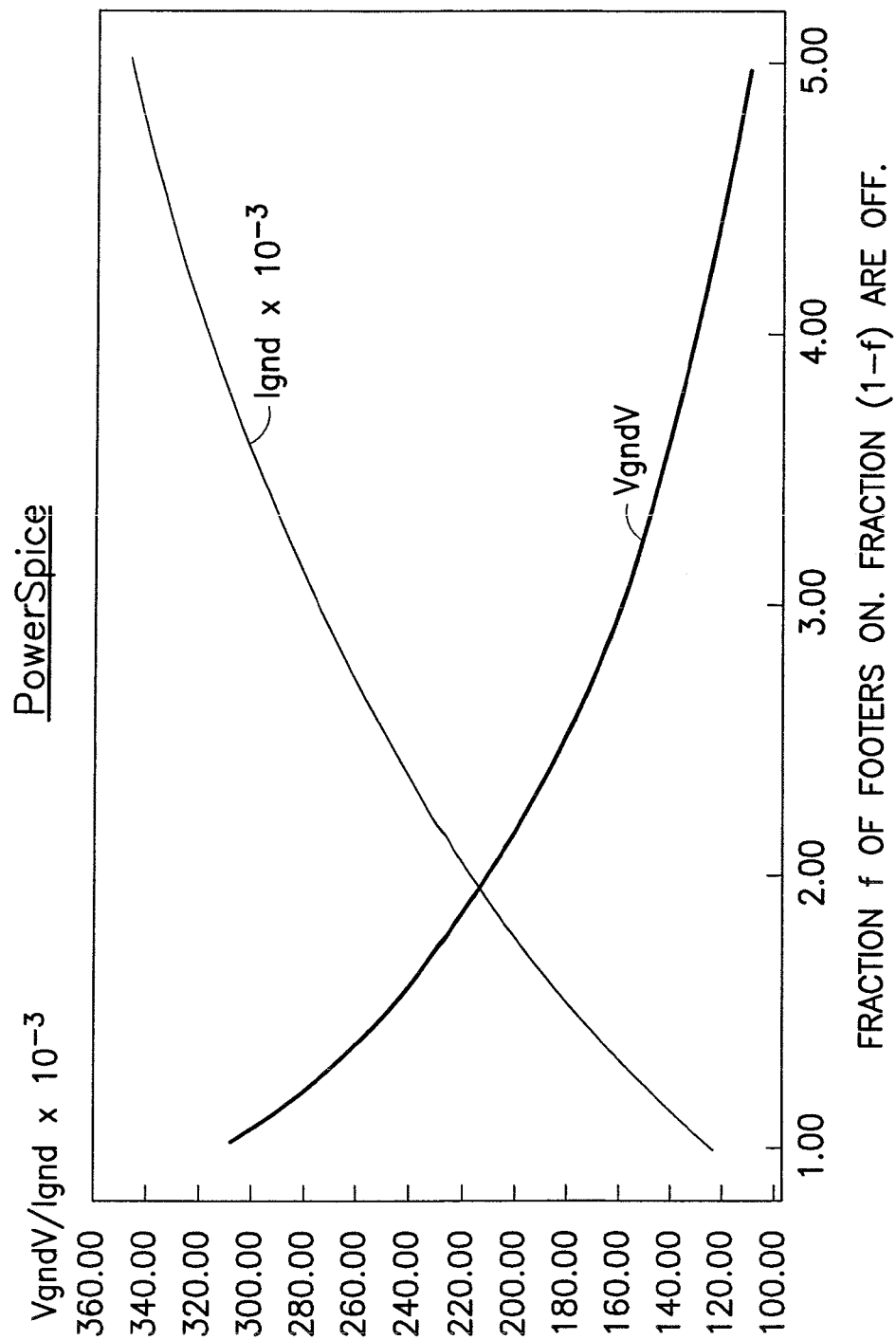
FIG. 8 is a graphical representation of $V_{clamp}$ and $I_{leak}$ as a function of fraction f, where f is the percentage of total NFETs which are always on and acting as voltage clamps.

In FIG. 8, the variation of $V_{clamp}$ and $I_{leak}$ as a function of f is shown, where f is the percentage of the total NFETs which are always on and act as voltage clamps. It will be observed that as more NFETs are turned on, the leakage current ($I_{gnd}$) increases while the voltage at the virtual ground rail ($V_{grdV}$) decreases. Even though we would like to reduce leakage as much as possible this would imply pushing up $V_{clamp}$. But pushing $V_{clamp}$ too much can push outputs which are at logic state "0" to an undetermined state. A safe value of $V_{clamp}$ has to be determined using knowledge of the worst case voltage tolerable as logic "0" and also keeping noise considerations in mind. In our experiments, we assumed 120 mV (=$V_{clamp}$) to be a safe value of $V_{GND}$ and to achieve that value required a very small fraction of 1% of the total NFETs to be voltage clamps.

Figure 9:
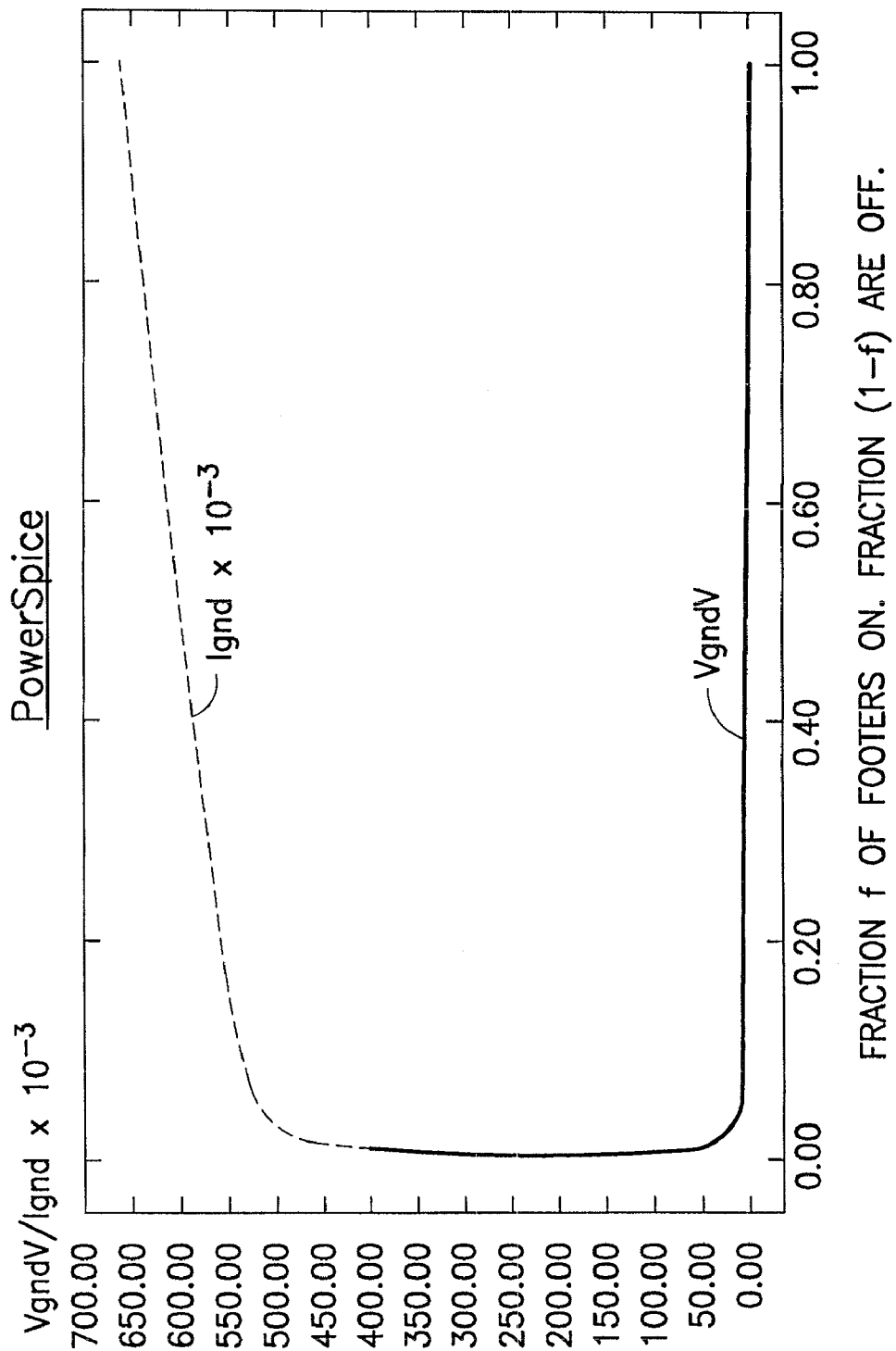
FIG. 9 is a graphical representation the variation of $V_{clamp}$ and $I_{leak}$ as a function of f, where f is the percentage of total NFETs which are always on and acting as a voltage clamps and where f is varied between 0.0 and 1.0.

FIG. 9 is similar to FIG. 8 except the fraction f is varied over the entire range from 0.0 to 1.0. When the fraction f is 1.0, it is equivalent to not having any footers at all, i.e. the circuit is not power gated. The current under this condition roughly corresponds to the leakage current if the circuit was not power gated and is about 0.68 mA. It does not exactly correspond because the circuit shown has some "on" NFETs which would be absent in a circuit without power gating. In actual experiments to compute power saving, we use a fall adder circuit without any NFETs. Assume that we have determined 120 mV to be a safe value for $V_{clamp}$. From FIG. 8, we find the fraction f for which $V_{clamp}$ is 120 mV to be about 4%. For this fraction of NFETs which are on, $I_{leak}$ is approximately 0.32 mA. From the two leakage values that we derive, we can see that we can get leakage savings of (0.68-0.32)/0.32=52% for $V_{clamp}$ of 120 mV. A table with accurate power savings numbers using a adder without any NFETs and a power gated adder is shown in Table 1. Note that the "No VC" column corresponds to the situation where footers are used for powergating without any voltage clamps (VC's).

TABLE 1

Leakage power savings as a function of $V_{clamp}$.

| | $V_{clamp}$ | | | |
|---|---|---|---|---|
| | 0 V | 0.1 V | 0.2 V | No VC |
| Savings | 0% | 34% | 60% | 94% |

It should be noted that a certain amount of energy is dissipated to turn the footers on and off. In our calculations we have ignored these numbers.

While there has been described and illustrated exemplary embodiments of power gating circuits able to have data retention and low manufacturing cost and variability immune properties and exemplary methods of implementing and tuning the circuits, it will be apparent to those skilled in the art that modifications and variations are possible without deviating from the broad principles and teachings of the present invention which shall be limited solely by the scope of the claims appended hereto.

What is claimed is:

1. A method of implementing power gating with a virtual rail voltage clamp of a semiconductor integrated circuit having a virtual ground rail comprising the steps of:
    adding $N_f$ quantity of NFETs to the integrated circuit between the virtual ground rail and a ground rail for power gating and virtual rail voltage clamping, where $N_f$ is a number of footer devices required to produce a certain amount of leakage reduction in the integrated circuit;
    adding $N_{max-VC}$ latches in a scan chain with the output of each latch coupled to a respective one of $N_{max-VC}$ NFETS of the $N_f$ NFETS, so that the $N_{max-VC}$ NFETs act as virtual rail voltage clamps, where $N_{max-VC}$ is the maximum number of footer devices needed for said virtual ground rail to be substantially at a voltage value $V_{clamp}$, where $V_{clamp}$ is a desired steady state voltage at the virtual ground rail; and coupling the remaining $(N_f - N_{max-VC})$ NFETs to a control signal, $S_{sleep_{13}n}$, for causing the $(N_f - N_{max-VC})$ NFETs to act as footer devices for implementing power gating of the integrated circuit.

2. A method of implementing power gating with a virtual rail voltage clamp of a semiconductor integrated circuit having a virtual ground rail as set forth in claim 1, further comprising the steps of:

manufacturing and testing an integrated circuit;

determining $V_{act-clamp}$ during said testing, where $V_{act-clamp}$ is a measured steady state voltage at the virtual ground rail;

providing a VC_CNT table storing the number of footer devices $(N_{act-VC})$ that have to be turned off or on to change $V_{act-clamp}$ to $V_{clamp}$, where $V_{clamp}$ is the desired steady state voltage at the virtual ground rail, and creating a scan pattern coupled to the $N_{max-VC}$ NFETs to produce a certain amount of leakage reduction in the logic circuit for ensuring that $N_{act-VC}$ NFETs act as virtual rail voltage clamps.

3. A signal bearing medium tangibly embodying a program of machine-readable instructions executable by a digital processing apparatus to perform operations to implement power gating with a virtual rail voltage clamp of a semiconductor integrated circuit having a virtual ground node, the operations comprising:

adding $N_f$ quantity of NFETs to the integrated circuit between the virtual ground rail and a ground rail for power gating and virtual rail voltage clamping, where $N_f$ is the number of footer devices required to produce a certain amount of leakage reduction in the integrated circuit;

adding $N_{max-Vc}$ latches in a scan chain with the output of each latch coupled to a respective one of $N_{max-VC}$ NFETS of the $N_f$NFETS, so that the $N_{max-VC}$ NFETs act as virtual rail voltage clamps, where $N_{max-VC}$ is the maximum number of footer devices needed for said virtual ground rail to be substantially at a voltage value $V_{clamp}$, where $V_{clamp}$ is the desired steady state voltage at the virtual ground rail; and coupling the remaining $(N_f - N_{max-VC})$ NFETs to a control signal, $S_{sleep\_n}$, for causing the $(N_f - N_{max-VC})$ NFETs to act as footer devices for implementing power gating of the integrated circuit.

4. A signal bearing medium as set forth in claim 3, further comprising the operations of:

manufacturing and testing an integrated circuit;

determining $V_{act-clamp}$ during said testing, where $V_{act-clamp}$ is a measured steady state voltage at the virtual ground rail;

providing a VC_CNT table storing a number of footer devices $(N_{act-VC})$ that have to be turned off or on to change $V_{act-clamp}$ to $V_{clamp}$, where $V_{clamp}$ is the desired steady state voltage at the virtual ground rail, and creating a scan pattern coupled to $(N_f - N_{max-VC})$ NFETs to produce a certain amount of leakage reduction in the logic circuit for ensuring that $N_{act-VC}$ NFETs act as virtual rail voltage clamps.

5. A method of implementing power gating with a virtual rail voltage clamp of a semiconductor integrated circuit having a virtual power rail comprising the steps of:

adding $P_f$ quantity of PFETs to the integrated circuit between the virtual power rail and a power rail for power gating and virtual rail voltage clamping, where $P_f$ is a number of header devices required to produce a certain amount of leakage reduction in the integrated circuit;

adding $P_{max-VC}$ latches in a scan chain with the output of each latch coupled to a respective one of $P_{max-VC}$ PFETS of the $P_f$PFETS, so that the $P_{max-VC}$ PFETs act as virtual rail voltage clamps, where $P_{max-VC}$ is the maximum number of header devices needed for said virtual power rail to be substantially at a voltage value $V_{clamp}$, where $V_{clamp}$ is a desired steady state voltage at the virtual power rail; and coupling remaining $(P_f - P_{max-VC})$ PFETs to a control signal, $S_{sleep\_n}$, for causing the $(P_f - P_{max-VC})$ PFETs to act as header devices for implementing power gating of the integrated circuit.

6. A method of implementing power gating with a virtual rail voltage clamp of a semiconductor integrated circuit having a virtual power rail as set forth in claim 5, further comprising the steps of:

manufacturing and testing an integrated circuit;

determining $V_{act-clamp}$ during said testing, where $V_{act-clamp}$ is a measured steady state voltage at the virtual power rail;

providing a VC_CNT table storing a number of header devices $(P_{act-VC})$ that have to be turned off or on to change $V_{act-clamp}$ to $V_{clamp}$, where $V_{clamp}$ is the desired steady state voltage at the virtual power rail, and creating a scan pattern coupled to the $(P_f - P_{max-VC})$ PFETs to produce a certain amount of leakage reduction in the logic circuit for ensuring that $P_{act-VC}$ PFETs act as virtual rail voltage clamps.

* * * * *